United States Patent
Chang

(10) Patent No.: US 8,878,584 B2
(45) Date of Patent: Nov. 4, 2014

(54) DUTY CYCLE CORRECTOR

(71) Applicants: Global Unichip Corp., Hsinchu (TW); Taiwan Semiconductor Manufacturing Co., Ltd., Hsin-Chu (TW)

(72) Inventor: Chun-Chi Chang, New Taipei (TW)

(73) Assignees: Global Unichip Corp., Hsinchu (TW); Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/890,413

(22) Filed: May 9, 2013

(65) Prior Publication Data

US 2013/0314137 A1     Nov. 28, 2013

(30) Foreign Application Priority Data

May 25, 2012   (TW) .............. 101118658 A

(51) Int. Cl.
*H03K 3/017*     (2006.01)
*H03K 5/156*     (2006.01)

(52) U.S. Cl.
CPC .............. *H03K 3/017* (2013.01); *H03K 5/1565* (2013.01)
USPC ......................................... 327/175; 327/176

(58) Field of Classification Search
CPC ......... H03K 5/04; H03K 5/05; H03K 5/1565; H03K 7/08; H03K 3/017
USPC ................................................... 327/172–176
See application file for complete search history.

(56) References Cited

U.S. PATENT DOCUMENTS

| | | | | |
|---|---|---|---|---|
| 5,638,016 A * | 6/1997 | Eitrheim | ........................ | 327/175 |
| 6,794,916 B1 * | 9/2004 | Varma | ............................ | 327/218 |
| 7,323,919 B2 * | 1/2008 | Yang et al. | .................... | 327/172 |
| 7,656,240 B2 * | 2/2010 | Wong et al. | ..................... | 331/57 |
| 7,733,143 B2 * | 6/2010 | Guo et al. | ...................... | 327/175 |

* cited by examiner

*Primary Examiner* — Patrick O'Neill
(74) *Attorney, Agent, or Firm* — McClure, Qualey & Rodack, LLP

(57) ABSTRACT

A duty cycle corrector includes an SR latch, a first switch and a second switch. The SR latch is configured to generate first and second control signals according to first and second clocks. The first switch is coupled between a work voltage and an output node, and selectively closes and opens according to the first control signal. The second switch is coupled between the output node and a ground voltage, and selectively closes and opens according to the second control signal. The output node is used to output an output clock.

11 Claims, 5 Drawing Sheets

DUTY CYCLE CORRECTOR

CROSS REFERENCE TO RELATED APPLICATIONS

This Application claims priority of Taiwan Patent Application No. 101118658 filed on May 25, 2012, the entirety of which is incorporated by reference herein.

BACKGROUND OF THE INVENTION

1. Field of the Invention

The disclosure generally relates to a duty cycle corrector, and more particularly, relates to a duty cycle corrector for supplying a stable output clock.

2. Description of the Related Art

A duty cycle corrector (DCC) is used to supply an output clock having a duty cycle of 50%. This is widely applied to circuits which require rising edges and falling edges of a clock, such as DDR SDRAM (Double Date Rate Synchronous Dynamic Random Access Memory), Double-Sampling ADC (Double Sampling Analog-to-Digital Converter), DLL (Delay Locked Loop), and PLL (Phase Locked Loop).

Traditionally, a duty cycle corrector has the following disadvantages: (1) the output clock is unstable due to variations in manufacturing processes; and (2) if an input clock does not have a duty cycle of 50%, there will be a short current from a work voltage to a ground voltage, thereby increasing power consumption.

BRIEF SUMMARY OF THE INVENTION

For solving the foregoing problems, the invention provides a duty cycle corrector for supplying a stable output clock and for reducing power consumption.

In an exemplary embodiment, the disclosure is directed to a duty cycle corrector, comprising: an SR latch, generating a first control signal and a second control signal according to a first clock and a second clock; a first switch, coupled between a work voltage and an output node, and selectively closing and opening according to the first control signal; and a second switch, coupled between the output node and a ground voltage, and selectively closing and opening according to the second control signal, wherein the output node is used to output an output clock.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
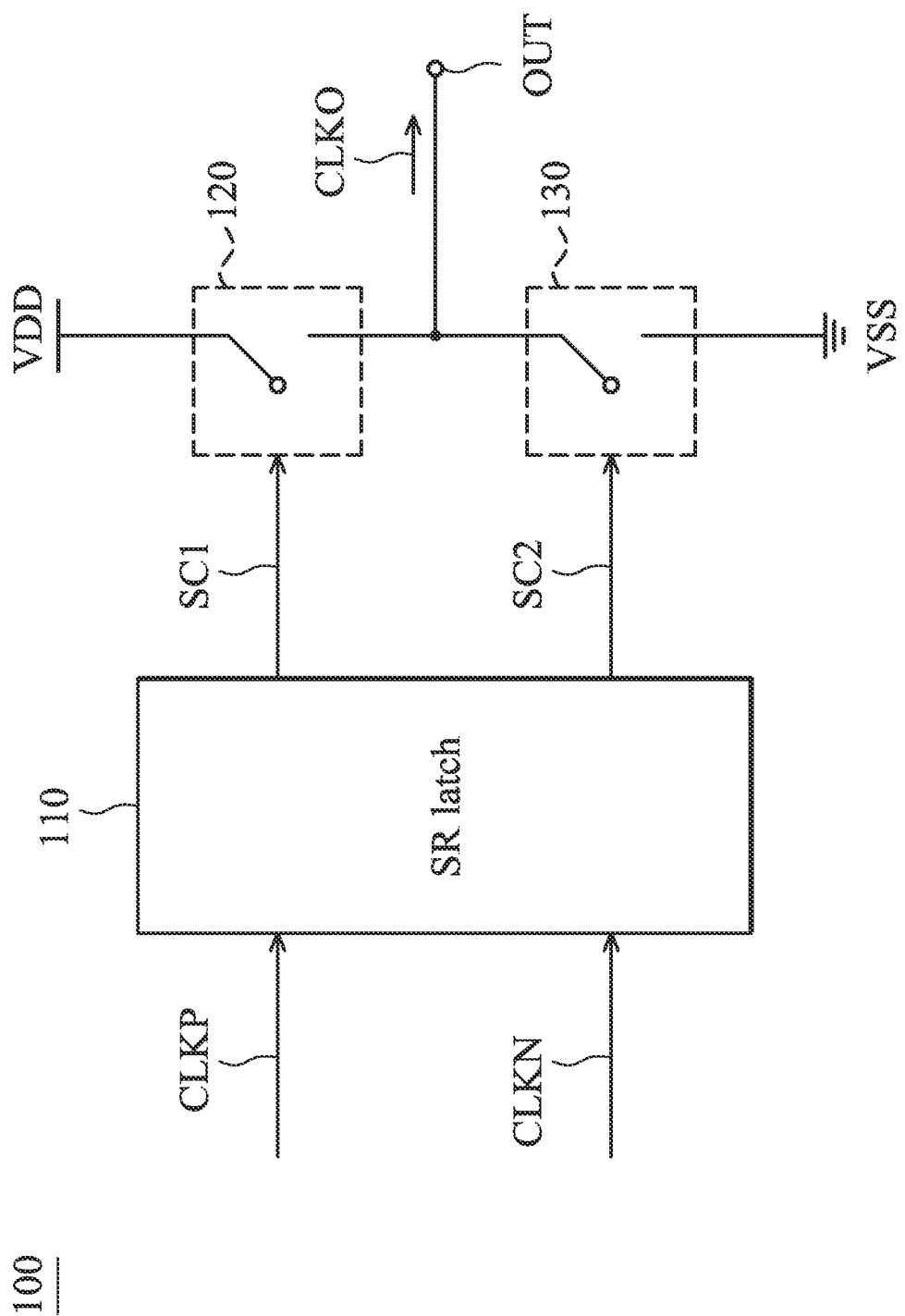
FIG. 1 is a diagram for illustrating a duty cycle corrector according to an embodiment of the invention.

FIG. 1 is a diagram for illustrating a duty cycle corrector 100 according to an embodiment of the invention. As shown in FIG. 1, the duty cycle corrector 100 comprises an SR latch 110, and two switches 120 and 130. The SR latch 110 generates two control signals SC1 and SC2 according to a clock CLKP and another clock CLKN. In an embodiment, the SR latch 110 has a set input terminal for receiving the clock CLKP, and a reset input terminal for receiving the clock CLKN. In another embodiment, the SR latch 110 has the reset input terminal for receiving the clock CLKP, and the set input terminal for receiving the clock CLKN. The switch 120 is coupled between a work voltage VDD and an output node OUT, and selectively closes and opens according to the control signal SC1. Similarly, the switch 130 is coupled between the output node OUT and a ground voltage VSS, and selectively closes and opens according to the control signal SC2. The output node OUT is used to output an output clock CLKO.

The work voltage VDD is higher than the ground voltage VSS. In some embodiments, the work voltage VDD is equal to 1.8V, and the ground voltage VSS is equal to 0V. The clock CLKP and the clock CLKN may have identical waveforms, and the phase difference between the clock CLKP and the clock CLKN may be equal to 180 degrees.

Figure 2:
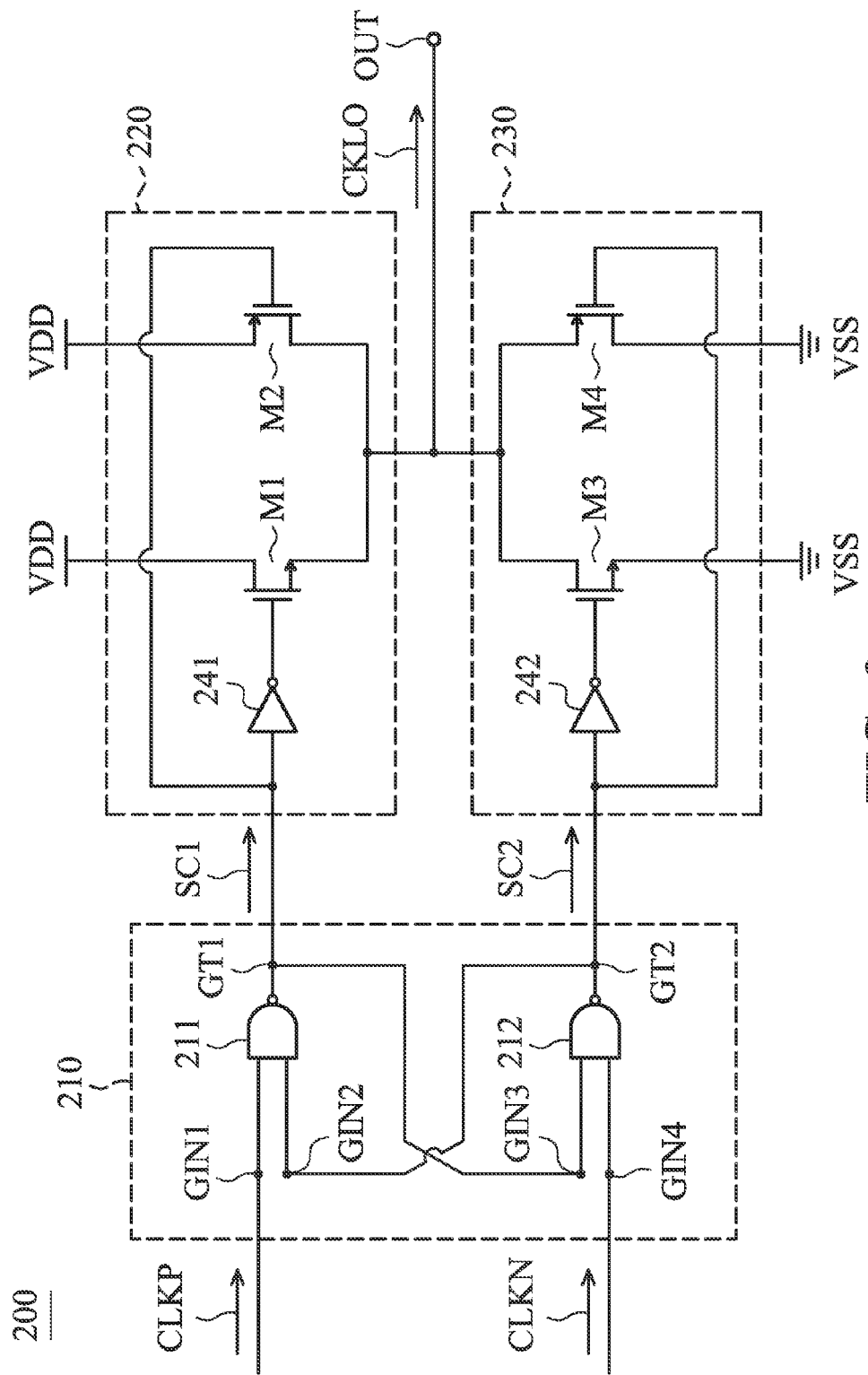
FIG. 2 is a diagram for illustrating a duty cycle corrector according to an embodiment of the invention.

FIG. 2 is a diagram for illustrating a duty cycle corrector 200 according to an embodiment of the invention. As shown in FIG. 2, the duty cycle corrector 200 comprises an SR latch 210, and two switches 220 and 230. The SR latch 210 comprises two NAND gates 211 and 212. The NAND gate 211 has two input terminals GIN1 and GIN2, and an output terminal GT1. The input terminal GIN1 receives the clock CLKP, and the output terminal GT1 outputs the control signal SC1. The NAND gate 212 has two input terminals GIN3 and GIN4, and an output terminal GT2. The input terminal GIN3 is coupled to the output terminal GT1, and the input terminal GIN4 receives the clock CLKN. The output terminal GT2 is coupled to the input terminal GIN2 and further outputs the control signal SC2. Note that in FIG. 2, the clock CLKP may be interchanged with the clock CLKN, and this does not affect the performance of the invention.

The switch 220 comprises two transistors M1 and M2, and an inverter 241. The transistor M1 is coupled between a work voltage VDD and an output node OUT. The transistor M2 is coupled between the work voltage VDD and the output node OUT, and has a gate coupled to the output terminal GT1. The inverter 241 is coupled between the output terminal GT1 and a gate of the transistor M1, and is configured to invert the control signal SC1. Similarly, the switch 230 comprises two transistors M3 and M4, and an inverter 242. The transistor M3 is coupled between the output node OUT and a ground voltage VSS. The transistor M4 is coupled between the output node OUT and the ground voltage VSS, and has a gate coupled to the output terminal GT2. The inverter 242 is coupled between the output terminal GT2 and a gate of the transistor M3, and is configured to invert the control signal SC2. In a preferred embodiment, each of the transistors M1 and M3 is an NMOS transistor (N-channel Metal-Oxide-Semiconductor Field-Effect Transistor), and each of the transistors M2 and M4 is a PMOS transistor (P-channel Metal-Oxide-Semiconductor Field-Effect Transistor).

TABLE I the truth table of the SR latch 210 (NAND)

| CLKP | CLKN | GT1 | GT2 |
|------|------|-----|-----|
| 1    | 0    | 0   | 1   |
| 0    | 1    | 1   | 0   |

TABLE I-continued the truth table of the SR latch 210 (NAND)

| CLKP | CLKN | GT1 | GT2 |
|---|---|---|---|
| 1 | 1 | Unchanged | Unchanged |
| 0 | 0 | 1 | 1 |

Table I is the truth table of the SR latch 210 shown in FIG. 2, wherein "1" represents a high logic level (or the work voltage VDD), and "0" represents a low logic level (or the ground voltage VSS). A current output value of the SR latch 210 is related to a preceding output value of the SR latch 210. If the clock CLKP and the clock CLKN are both equal to logic level "1", the output value of each of the output terminals GT1 and GT2 will be unchanged.

According to Table I, the SR latch 210 never generates logic levels "0" at the output terminals GT1 and GT2 simultaneously. Therefore, the switches 220 and 230 will not close simultaneously. The embodiment can eliminate the short current from the work voltage VDD to the ground voltage VSS, thereby reducing power consumption of the duty cycle corrector 200.

Figure 3:
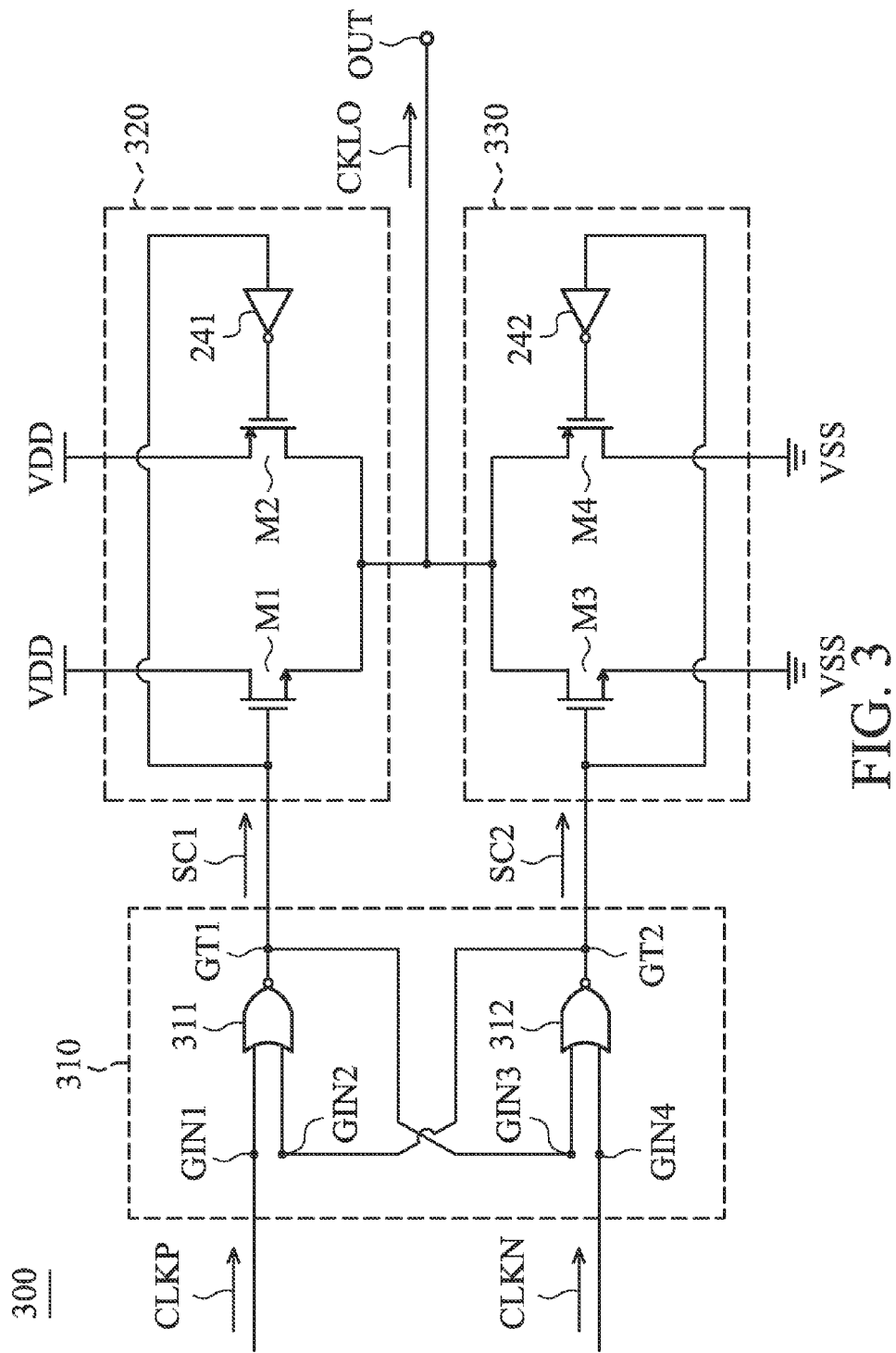
FIG. 3 is a diagram for illustrating a duty cycle corrector according to an embodiment of the invention.

FIG. 3 is a diagram for illustrating a duty cycle corrector 300 according to an embodiment of the invention. As shown in FIG. 3, the duty cycle corrector 300 comprises an SR latch 310, and two switches 320 and 330. The SR latch 310 comprises two NOR gates 311 and 312. The NOR gate 311 has two input terminals GIN1 and GIN2, and an output terminal GT1. The input terminal GIN1 receives the clock CLKP, and the output terminal GT1 outputs the control signal SC1. The NOR gate 312 has two input terminals GIN3 and GIN4, and an output terminal GT2. The input terminal GIN3 is coupled to the output terminal GT1, and the input terminal GIN4 receives the clock CLKN. The output terminal GT2 is coupled to the input terminal GIN2 and further outputs the control signal SC2. Note that in FIG. 3, the clock CLKP may be interchanged with the clock CLKN, and this does not affect the performance of the invention.

The switch 320 comprises two transistors M1 and M2, and an inverter 241. The transistor M1 is coupled between a work voltage VDD and an output node OUT, and has a gate coupled to the output terminal GT1. The transistor M2 is coupled between the work voltage VDD and the output node OUT. The inverter 241 is coupled between the output terminal GT1 and a gate of the transistor M2, and is configured to invert the control signal SC1. Similarly, the switch 330 comprises two transistors M3 and M4, and an inverter 242. The transistor M3 is coupled between the output node OUT and a ground voltage VSS, and has a gate coupled to the output terminal GT2. The transistor M4 is coupled between the output node OUT and the ground voltage VSS. The inverter 242 is coupled between the output terminal GT2 and a gate of the transistor M4, and is configured to invert the control signal SC2. In a preferred embodiment, each of the transistors M1 and M3 is an NMOS transistor (N-channel Metal-Oxide-Semiconductor Field-Effect Transistor), and each of the transistors M2 and M4 is a PMOS transistor (P-channel Metal-Oxide-Semiconductor Field-Effect Transistor).

TABLE II the truth table of the SR latch 310 (NOR)

| CLKP | CLKN | GT1 | GT2 |
|---|---|---|---|
| 1 | 0 | 0 | 1 |
| 0 | 1 | 1 | 0 |
| 1 | 1 | 0 | 0 |
| 0 | 0 | Unchanged | Unchanged |

Table II is the truth table of the SR latch 310 shown in FIG. 3, wherein "1" represents a high logic level (or the work voltage VDD), and "0" represents a low logic level (or the ground voltage VSS). A current output value of the SR latch 310 is related to a preceding output value of the SR latch 310. If the clock CLKP and the clock CLKN are both equal to logic level "0", the output value of each of the output terminals GT1 and GT2 will be unchanged.

According to Table II, the SR latch 310 never generates logic levels "1" at the output terminals GT1 and GT2 simultaneously. Therefore, the switches 320 and 330 will not close simultaneously. The embodiment can eliminate the short current from the work voltage VDD to the ground voltage VSS, thereby reducing power consumption of the duty cycle corrector 300.

Figure 4:
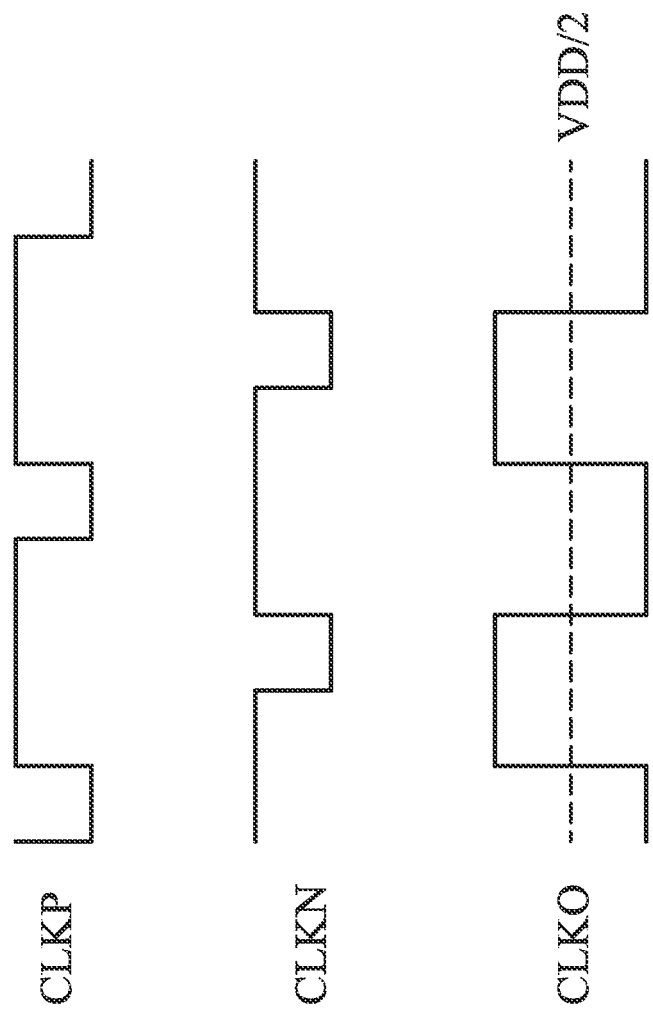
FIG. 4 is a diagram for illustrating waveforms of a duty cycle corrector according to an embodiment of the invention.

FIG. 4 is a diagram for illustrating waveforms of a duty cycle corrector according to an embodiment of the invention. As shown in FIG. 4, if a duty cycle of an input clock is greater than 50%, an output clock CLKO of the duty cycle corrector will have rising edges and falling edges that are determined by falling edges of the input clock. On the contrary, if the duty cycle of the input clock is smaller than 50%, the output clock CLKO of the duty cycle corrector will have rising edges and falling edges that are determined by rising edges of the input clock. The duty cycle corrector of the invention is capable of supplying the output clock CLKO having the duty cycle of 50% exactly.

Figure 5:
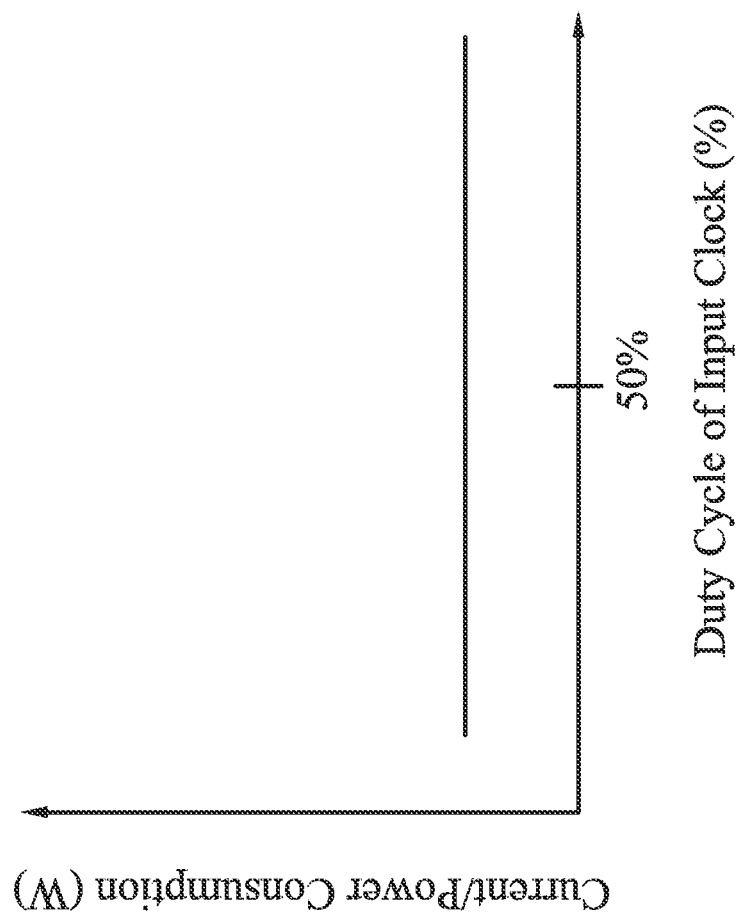
FIG. 5 is a diagram for illustrating current/power consumption of a duty cycle corrector according to an embodiment of the invention.

FIG. 5 is a diagram for illustrating current/power consumption of a duty cycle corrector according to an embodiment of the invention. As shown in FIG. 5, no matter how the duty cycles of the clock CLKP and CLKN vary, the duty cycle corrector of the invention will maintain constant power consumption.

The duty cycle corrector of the invention can supply a stable output clock through the SR latch constructed by NAND gates or NOR gates even if manufacturing processes are slightly different. In addition, the short current is eliminated by the duty cycle corrector. The invention can maintain low and stable power consumption even if an input clock has different duty cycles.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A duty cycle corrector, comprising:
   an SR latch, generating a first control signal and a second control signal according to a first clock and a second clock;
   a first switch, coupled between a work voltage and an output node, and selectively closing and opening according to the first control signal; and
   a second switch, coupled between the output node and a ground voltage, and selectively closing and opening according to the second control signal,
   wherein the output node is used to output an output clock;
   wherein a first input terminal of the SR latch is arranged to directly receive the first clock, a second input terminal of the SR latch is arranged to directly receive the second clock, a first output terminal of the SR latch is directly connected to a control terminal of the first switch, and a second output terminal of the SR latch is directly connected to a control terminal of the second switch.

2. The duty cycle corrector as claimed in claim 1, wherein a phase difference between the first clock and the second clock is equal to 180 degrees.

3. The duty cycle corrector as claimed in claim 1, wherein the SR latch comprises:
   a first NAND gate, having:
   a first input terminal, receiving the first clock;
   a second input terminal; and
   a first output terminal, outputting the first control signal; and
   a second NAND gate, having:
   a third input terminal, coupled to the first output terminal;
   a fourth input terminal, receiving the second clock; and
   a second output terminal, coupled to the second input terminal, and outputting the second control signal.

4. The duty cycle corrector as claimed in claim 3, wherein the first switch comprises:
   a first transistor, coupled between the work voltage and the output node, and having a first gate;
   a second transistor, coupled between the work voltage and the output node, and having a second gate coupled to the first output terminal; and
   a first inverter, coupled between the first output terminal and the first gate.

5. The duty cycle corrector as claimed in claim 4, wherein the second switch comprises:
   a third transistor, coupled between the output node and the ground voltage, and having a third gate;
   a fourth transistor, coupled between the output node and the ground voltage, and having a fourth gate coupled to the second output terminal; and
   a second inverter, coupled between the second output terminal and the third gate.

6. The duty cycle corrector as claimed in claim 5, wherein each of the first transistor and the third transistor is an NMOS transistor (N-channel Metal-Oxide-Semiconductor Field-Effect Transistor), and each of the second transistor and the fourth transistor is a PMOS transistor (P-channel Metal-Oxide-Semiconductor Field-Effect Transistor).

7. The duty cycle corrector as claimed in claim 1, wherein the SR latch comprises:
   a first NOR gate, having:
   a first input terminal, receiving the first clock;
   a second input terminal; and
   a first output terminal, outputting the first control signal; and
   a second NOR gate, having:
   a third input terminal, coupled to the first output terminal;
   a fourth input terminal, receiving the second clock; and
   a second output terminal, coupled to the second input terminal, and outputting the second control signal.

8. The duty cycle corrector as claimed in claim 7, wherein the first switch comprises:
   a first transistor, coupled between the work voltage and the output node, and having a first gate coupled to the first output terminal;
   a second transistor, coupled between the work voltage and the output node, and having a second gate; and
   a first inverter, coupled between the first output terminal and the second gate.

9. The duty cycle corrector as claimed in claim 8, wherein the second switch comprises:
   a third transistor, coupled between the output node and the ground voltage, and having a third gate coupled to the second output terminal;
   a fourth transistor, coupled between the output node and the ground voltage, and having a fourth gate; and
   a second inverter, coupled between the second output terminal and the fourth gate.

10. The duty cycle corrector as claimed in claim 9, wherein each of the first transistor and the third transistor is an NMOS transistor (N-channel Metal-Oxide-Semiconductor Field-Effect Transistor), and each of the second transistor and the fourth transistor is a PMOS transistor (P-channel Metal-Oxide-Semiconductor Field-Effect Transistor).

11. The duty cycle corrector as claimed in claim 1, wherein the work voltage is higher than the ground voltage.

* * * * *